United States Patent

Spaeth et al.

Patent Number: 5,218,223
Date of Patent: Jun. 8, 1993

[54] OPTO-ELECTRONIC SEMICONDUCTOR COMPONENT

[75] Inventors: Werner Spaeth, Holzkirchen; Wolf Jakowetz, Vaterstetten; Herbert Schaefer, Hohenkirchen-Sieg.Brunn; Michael Besand, Germering; Karl Osojnik, Munich, all of Fed. Rep. of Germany

[73] Assignee: Siemens Aktiengesellschaft, Munich, Fed. Rep. of Germany

[21] Appl. No.: 524,442

[22] Filed: May 17, 1990

[30] Foreign Application Priority Data

May 19, 1989 [EP] European Pat. Off. ............ 89109085

[51] Int. Cl.$^5$ ...................... H01L 31/02; H01L 29/06
[52] U.S. Cl. .................................... 257/436; 257/437; 257/466; 257/98; 250/551; 250/214.1
[58] Field of Search ............................ 357/30, 17, 19; 250/211 J, 551

[56] References Cited

U.S. PATENT DOCUMENTS 3,443,140  5/1969  Ing et al. ................................. 357/17
4,896,195  1/1990  Jansen et al. ........................... 357/17

FOREIGN PATENT DOCUMENTS 52-35992   3/1977  Japan .................................... 357/30
63-237467 10/1988  Japan .................................... 357/17

OTHER PUBLICATIONS

Tompkins, J. D., "Integrated Optics Waveguide", IBM Technical Disclosure Bulletin, vol. 20, No. 11B, Apr. 1978, pp. 4714–4715.

Chappell, T. I., "The V-Groove Multijunction Solar Cell", IEEE Transactions, vol. ED-26, No. 7, Jul. 1979, pp. 1091–1097.

Redfield, D., "Multiple-Pass Thin-Film Silicon Solar Cell", Applied Physics Letters, vol. 25, No. 11, Dec. 1974, pp. 647–648.

Primary Examiner—Jerome Jackson
Attorney, Agent, or Firm—Hill, Steadman & Simpson

[57] ABSTRACT

An opto-electronic semiconductor component having a light transmission or receiving property including a light emitting or detecting active zone lying parallel to the principle surface of the semiconductor crystal is formed so that it detects or emits light directed parallel to the active zone with high efficiency. This enables the component to be hybridize with other electrical, electro-optical or optical elements in a single plane. At least one lateral surface of the semiconductor crystal is inclined at an angle to the principle surface of the component such that light directed into or from the crystal in a direction parallel to the active zone experiences deflection by refraction or reflection toward or away from the active zone.

3 Claims, 2 Drawing Sheets

OPTO-ELECTRONIC SEMICONDUCTOR COMPONENT

BACKGROUND OF THE INVENTION

1. Field of the Invention

The present invention relates generally to an opto-electronic semiconductor component having light transmitting or light receiving properties and including a planar light emitting or light detecting active zone lying parallel to the surface of a semiconductor crystal.

2. Description of the Related Art

Opto-electronic semiconductor components are well known and are used in increasing numbers as light waveguide (LWG) components for message transmission.

For example, a conventional semiconductor photodiode is composed of a semiconductor lamina and the light-absorbing layer lies parallel to the surface of the lamina. The efficiency of the diode is at a maximum when light is incident perpendicular relative to the absorbent layer, in other words, relative to the active zone of the photodiode.

To be able to detect a light beam derived from a semiconductor laser or the light exiting from a light waveguide or from an optical fiber with such diodes, the respective components must be constructed on planes tilted relative to one another so that, for example, a three-dimensional structure is required. Due to the necessarily three-dimensional arrangement of the individual elements relative to one another, the mounting planes and the assembly process itself, for example, bonding on a slanted plane, are extremely expensive, and/or extremely time consuming and susceptible to errors.

Of course, light-emitting, opto-electronic components or, light-waveguide semiconductor components such as, for example, surface emitters also have these disadvantages. Such an arrangement is especially problemmatical when it is necessary to hybridize such components with various electrical and electro-optical components such as laser diodes, and/or with other optical elements such as spherical lenses or fibers.

SUMMARY OF THE INVENTION

It is an object of the present invention to detect or emit light with a high efficiency which is laterally incident to or which laterally emerges from an active zone of an opto-electronic semiconductor component. It is also an object of the invention to enable the hybridization of an opto-electronic semiconductor component with other electrical, electro-optical or optical elements in a single plane.

These and other objects and advantages of the invention are achieved by an opto-electronic semiconductor component having a planar light-emitting or light-detecting active zone lying parallel to the surface of the semiconductor crystal, and at least one lateral surface of the semiconductor crystal being inclined at such an angle relative to the surface that light beamed into the semiconductor crystal parallel to the active surface or emitted from the semiconductor generally crystal in a generally parallel direction to the active surface experiences a deflection toward or, respectively away from the active zone by refraction and/or reflection.

In other words, the semiconductor crystal is provided with at least one lateral surface at an angle which causes light entering the crystal in a direction generally parallel to the active zone to be directed generally perpendicular to the active zone for maximum efficiency. When the component is a light emitter rather than a light detector, the emitted light is redirected by the lateral surface(s) from a direction generally perpendicular to the active zone to exit the crystal generally parallel to the active zone. This makes combining such components with other components easier.

Advantageous developments and improvements of the invention are achieved in an opto-electronic semiconductor component as described above in which the lateral surface or surfaces are inclined relative to the principle surface of the semiconductor crystal and are of at least a first order. The lateral surfaces of the semiconductor crystal may be provided either with a reflecting layer or with an anti-reflection layer. In a preferred development, the semiconductor component is a photodiode. The semiconductor component may alternately be a surface emitter.

A method for manufacturing an opto-electronic semiconductor component of the present invention is characterized by a plurality of individual semiconductor components being produced on a common substrate, the additional substrate material for connection to neighboring components being offered at least at one lateral surface of the components and the components being detached from the common wafer after fabrication.

The advantages achieved with the invention, are, in particular, that, due to the specific shaping of an inherently conventional opto-electronic semiconductor component, an optimum lateral emission of the light generated in the active zone of the component or, respectively, an optimum conversion of light which is laterally incident into the component is achieved in the active zone. Due to the lateral light incidence or, respectively, the lateral light emission, in other words, in a direction parallel to the surface of the component or of the active zone thereof and not, as usual, in the direction of the surface normal, an arrangement of such components with other like or different optical, electrical or opto-electronic components on a single surface or plane is possible.

For example, a photo-diode in the form of a planar semiconductor photo-diode can be used where one or more lateral surfaces are formed as such an angle relative to one another that the light incident parallel to the active zone is deflected toward the active zone by refraction and/or reflection. These surfaces are inclined relative to one another and need not necessarily be planer surfaces. In other words, the surfaces may be of a first order, but under certain conditions may even be advantageously fashioned as surfaces of the second or of a higher order so that a focusing of the light or other beam is also achieved. It can also be advantageous to coat the lateral surfaces with a suitable material such as a reflective coating, or silvering, or an anti-reflection coating. An arrangement of the lateral surfaces according to the invention may be used to deflect the light beams from a surface emitter such that they emerge at the lateral surfaces of this opto-electronic semiconductor component.

A significant improvement is provided by the invention in that opto-electronic semiconductor components that are preferably used as light-waveguide components on a common wafer are fabricated. To that end, it is expedient to offer additional substrate material for the joining of the neighboring components at at least one lateral surface of the respective discreet component on the common semiconductor wafer. Alternately, it is expedient to provide an adequate spacing between the individual components to be fabricated on the wafer so that they may be detached from the common wafer after their manufacture by, for example, sawing or breaking.

BRIEF DESCRIPTION OF THE DRAWINGS

The invention shall be set forth in greater detail below with reference to exemplary embodiments shown in the drawings.

DESCRIPTION OF THE PREFERRED EMBODIMENTS

Figure 1:
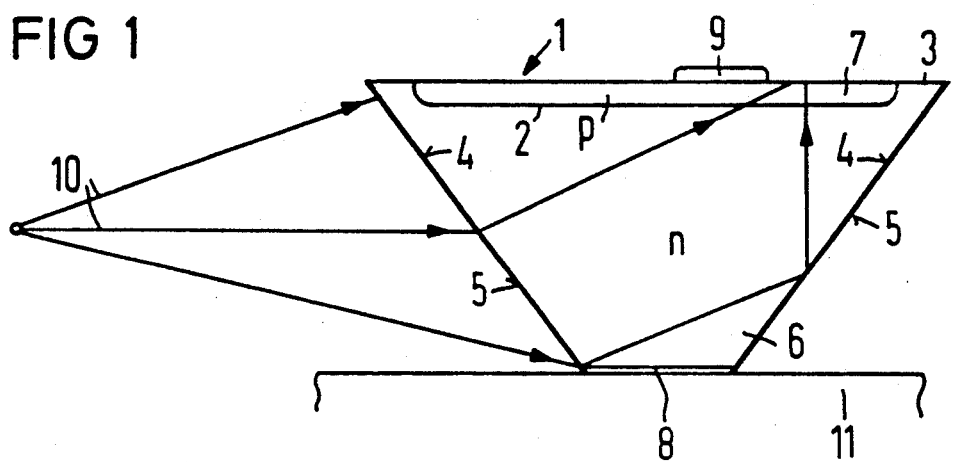
FIG. 1 is a side view of a receiver diode in an upside down assembly.
Figure 2:
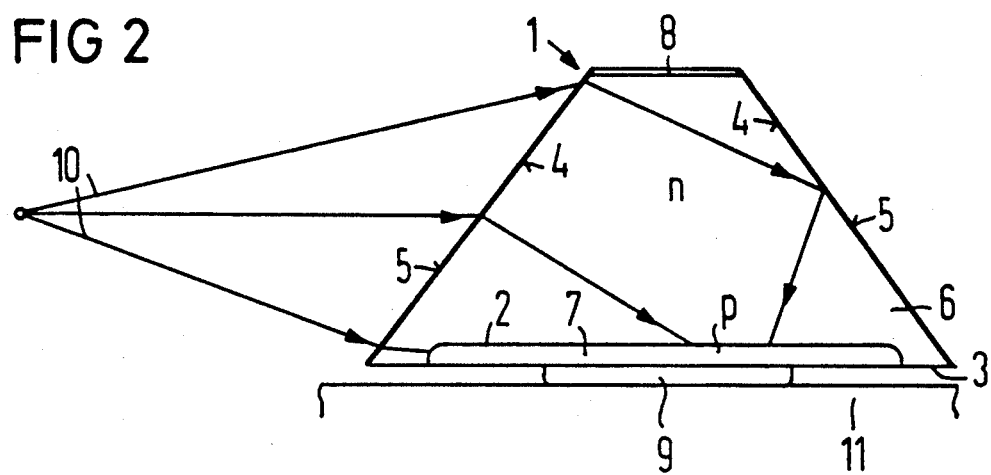
FIG. 2 is a side view of a receiver diode similar to that of FIG. 1 and turned upside down relative thereto.

FIGS. 1 and 2 show receiver diodes which are essentially composed of a semiconductor crystal 1 of an n-conductive substrate 6 having a surface 3 into which a p-diffusion region 7 is embedded so that a planar pn-junction is formed which represents an active zone 2 of the component. The p-diffusion region 7 is provided with a p-contact 9 and the n-substrate 6 is provided with an n-contact layer 8.

Surface passivation provided on the surface 3 of the semiconductor crystal 1 is omitted in the Figures for greater clarity.

In the exemplary embodiment shown in FIG. 1, the semiconductor crystal 1 is attached on a carrier 11 in an upside down assembly so that its underside is provided with the n-contact layer 8 facing away from the surface 3 and the active zone 2. The carrier 11 is composed of, for example, ceramic or silicon, and may be used for contacting or for accepting electrical lines or interconnections.

In the exemplary embodiment illustrated in FIG. 2, the surface 3 has the active zone 2 of the receiver diode or of the semiconductor crystal 1 facing toward the carrier 11 and is secured thereon in an upside down assembly. Fastening thereby ensues via the p-contact 9 with which the p-diffusion region 7 in the n-conductive substrate 6 of the semiconductor crystal 1 is provided.

Lateral surfaces 4 of the semiconductor crystal are inclined at an angle to the surface 3 such that the light beamed into the semiconductor crystal 1 in the form of a light cone 10 is deflected upon entry into the crystal by refraction at one of the lateral surfaces 4 and then is deflected in the interior of the crystal at the other opposite lateral surface 4 by reflection or by total reflection. The light is deflected to the active zone 2, which in this embodiment is a light detecting zone 2.

The embodiment of FIG. 2 is upside down with respect to the embodiment of FIG. 1. An anti-reflection coating or a mirroring on the lateral surfaces 4 can further enhance the deflection effect. The possibility of using such a silvering or anti-reflection coating is indicated in the Figures by a layer 5 on the lateral surfaces 4.

Figure 3:
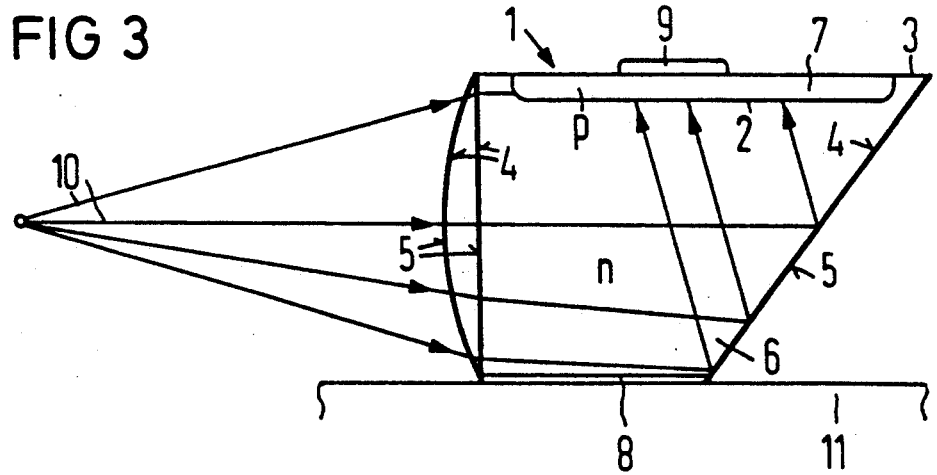
FIG. 3 is a side view of a further embodiment of a receiver diode.
Figure 4:
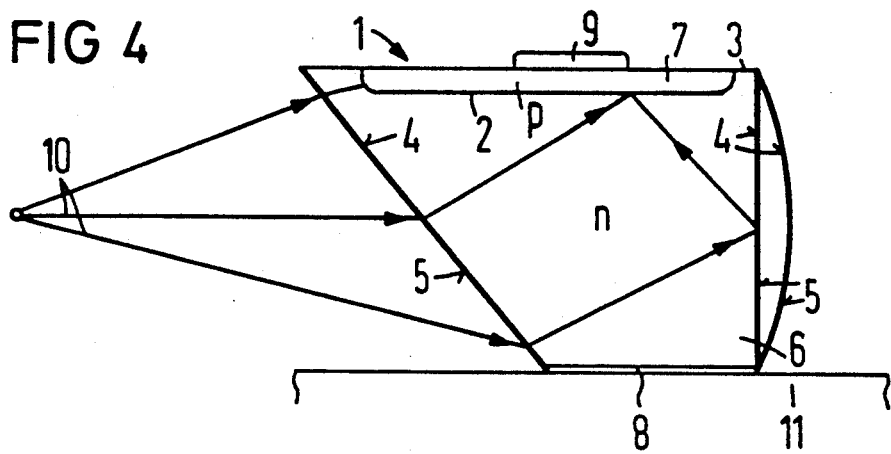
FIG. 4 is a side view of yet another embodiment of a receiver diode.

In terms of the internal structure, the receiver diodes illustrated in FIGS. 3 and 4 are the same as the exemplary embodiments of FIGS. 1 and 2 and both alternatives can be secured to a carrier 11 of, for example, silicon or ceramic in an upside down technique as well as in an illustrated upside down assembly technique. The fastening ensues via the n-contact layer 8. The n-conductive substrate 6 of the semiconductor crystal 1 has its underside provided with this layer. This underside lies opposite the surface 3 or the p-diffusion 7 and its p-contact 9.

The light irradiation into the diode in both exemplary embodiments again ensues in a direction generally parallel to the active zone 2 in the semiconductor crystal 1. In the exemplary embodiment of FIG. 3, the light beams are internally incident onto the lateral surface 4 fashioned as a planer surface (a surface of the first order) or as a convex surface (surface of the second order) and are refracted upon transition into the optically denser medium of the crystal 1 and are subsequently reflected in the interior of the crystal at an opposite lateral surface 4. The light beams 10 are reflected in a nearly perpendicular direction to the active zone 2.

In the exemplary embodiment shown in FIG. 4, the light refraction of the light beams 10 incident into the semiconductor crystal 1 ensues at the planar lateral surface 4 as a result of the inclination thereof. One part of the beam 10 is already directly steered into the active zone 2 in the semiconductor crystal 1, whereas the remaining portion of the beam 10 is deflected toward the active zone 2 by reflection or by total internal reflection at the other planarly or convexly formed lateral surface 4.

Figure 5:
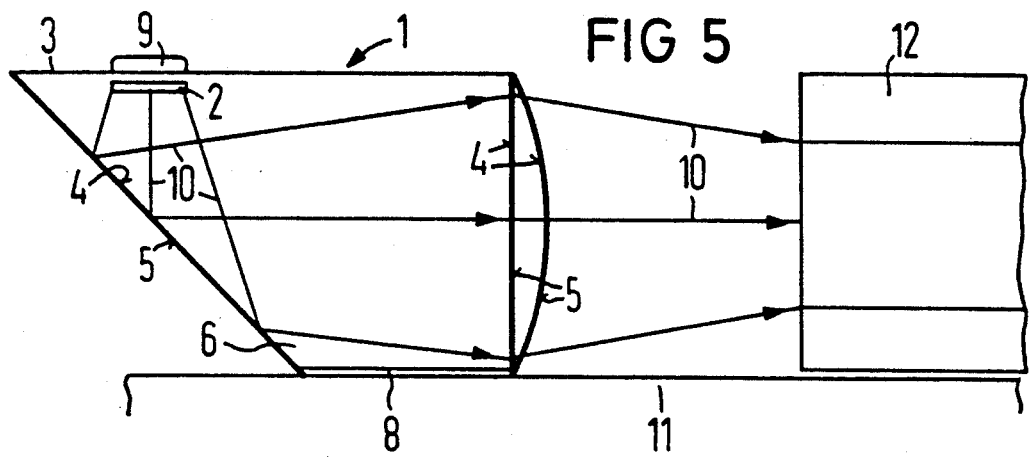
FIG. 5 is a side view of a surface emitter according to the invention directing light into an optical fiber.

An opto-electronic semiconductor component is shown in FIG. 5 in the form of a surface emitter and is coupled to an optical fiber 12 which is preferably used for optical message transmissions. The internal structure of the surface emitter is of a conventional type. The semiconductor crystal 1 has a hetero-structure format. For example, in a double hetero-structure, the active zone 2 is relatively thin and is enclosed by two layers having a higher band spacing. The semiconductor crystal 1 has its surface 3 provided with a p-contact 9 and has its underside provided with a contact layer 8 secured on the carrier 11 that, for example, is composed of silicon or ceramic. The contact layer is secured laterally relative to the optical fiber 12 arranged on the same carrier 11. Light rays 10 generated in the active zone 2 emerge nearly perpendicularly from the zone 2 and due to the lateral surface 4 of the crystal that is correspondingly inclined relative to the surface 3 is then deflected by total reflection onto the other opposite lateral surface such that they depart the semiconductor through the lateral surface 4 nearly parallel to the active zone 2 or to the surface 3. The beams depart laterally in the direction of the optical axis of the optical fiber 12. The lateral surface 4 facing toward the optical fiber 12 is preferably a planer or a convex surface. Further, it is advantageous to coat the lateral surfaces 4 with a layer in a desired way.

Figure 6:
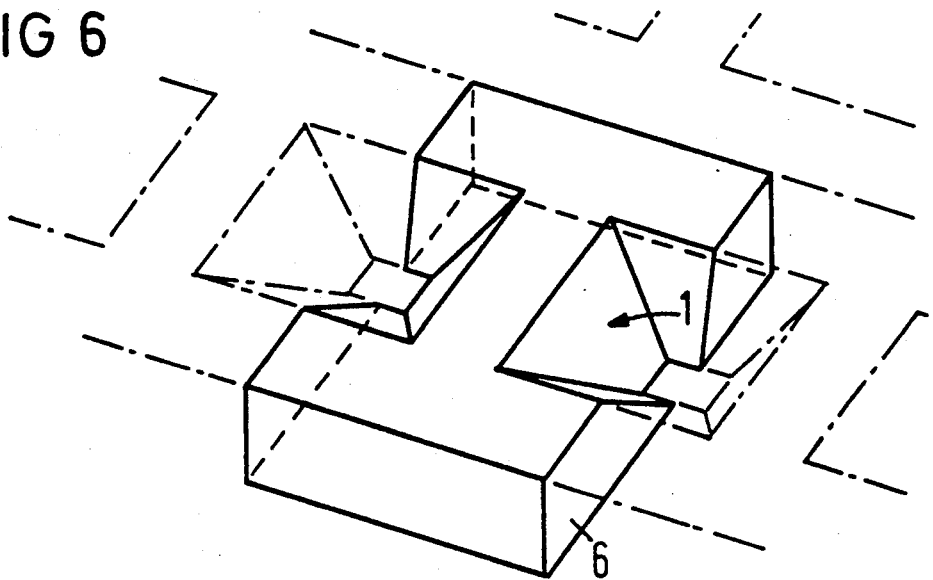
FIG. 6 is a perspective view, partially in phantom, of a receiver diode in a wafer union, or common wafer.

FIG. 6 shows an opto-electronic semiconductor component in the form of a receiver diode in a wafer union, or common wafer. A plurality of such opto-electronic semiconductor components may be simultaneously manufactured in an especially rational way in such a union. The common semiconductor wafer 6 serves as a point of departure, the layer sequence desired for the individual semiconductor crystals 1 being introduced thereinto and the required component contours being etched therefrom. It is thereby especially expedient to provide additional substrate material for a later connection to neighboring components at at least one of the lateral surfaces of the respective components. After the internal and external structuring, the components are detached from the wafer union, have their contacts finished, and may possibly be surrounded by a housing.

Thus there has been shown and described an opto-electronic semiconductor having light transmission or reception properties which includes a light emitting or light detecting active zone lying parallel to the principle surface of a semiconductor crystal and fashioned so that it detects or emits light laterally incident or emergent thereto, in other words, parallel to the active zone, with a high efficiency. A hybirdization of the component with other elements is possible in a single plane by providing at least one lateral surface of the semiconductor crystal inclined at an angle such that the light into the semiconductor crystal in a direction parallel to the active zone or from the crystal in a direction parallel to the active zone experiences deflection by refraction and/or reflection toward or away form the active zone. The present component is particularly useful as a light waveguide component.

Although other modifications and changes may be suggested by those skilled in the art, it is the intention of the inventors to embody within the patent warranted hereon all changes and modifications as reasonably and properly come within the scope of their contribution to the art.

We claim:

1. An opto-electronic semiconductor component, comprising:

a semiconductor crystal having a first surface;

a planar light emitting or receiving active zone lying parallel to said first surface of said semiconductor crystal; and means for either directing light traveling substantially parallel to said active zone in a direction generally normal to said active zone or for directing light traveling substantially perpendicular to said active zone in a direction generally parallel to said active zone, said means comprising at least one lateral surface on said semiconductor crystal inclined at an angle relative to said first surface so that light emitted generally perpendicularly from said active zone when said active zone is operated to emit light is directed substantially parallel to said active zone or so that light entering said crystal substantially parallel to said active zone is directed generally perpendicular toward said active zone for receipt thereby, said directing of the light being by reflection.

2. An opto-electronic semiconductor component, comprising:

a semiconductor crystal having a first surface;

a planar light emitting or receiving active zone lying parallel to said first surface of said semiconductor crystal;

means for either directing light traveling substantially parallel to said active zone in a direction generally normal to said active zone or for directing light traveling substantially perpendicular to said active zone in a direction generally parallel to said active zone, said means comprising at least one lateral surface on said semiconductor crystal inclined at an angle relative to said first surface so that light emitted generally perpendicularly from said active zone when said active zone is operated to emit light is directed substantially parallel to said active zone or so that light entering said crystal substantially parallel to said active zone is directed generally perpendicular toward said active zone for receipt thereby, and a layer on said at least one lateral surface, said layer being a reflective coating.

3. An opto-electronic semiconductor component, comprising:

a semiconductor crystal having a first surface;

a planar light emitting or receiving active zone lying parallel to said first surface of said semiconductor crystal; and means for either directing light traveling substantially parallel to said active zone in a direction generally normal to said active zone or for directing light traveling substantially perpendicular to said active zone in a direction generally parallel to said active zone, said means comprising at least one lateral surface on said semiconductor crystal inclined at an angle relative to said first surface so that light emitted generally perpendicularly from said active zone when said active zone is operated to emit light is directed substantially parallel to said active zone or so that light entering said crystal substantially parallel to said active zone is directed generally perpendicular toward said active zone for receipt thereby, wherein said semiconductor component is a surface emitter.

* * * * *